(12) United States Patent
Chaji et al.

(10) Patent No.: US 8,914,246 B2
(45) Date of Patent: Dec. 16, 2014

(54) SYSTEM AND METHODS FOR AGING COMPENSATION IN AMOLED DISPLAYS

(75) Inventors: Gholamreza Chaji, Waterloo (CA); Joseph Marcel Dionne, Waterloo (CA); Yaser Azizi, Waterloo (CA); Javid Jaffari, Kitchener (CA); Abbas Hormati, Kitchener (CA); Tong Liu, Waterloo (CA); Stefan Alexander, Waterloo (CA)

(73) Assignee: Ignis Innovation Inc., Waterloo, ON (CA)

( * ) Notice: Subject to any disclaimer, the term of this patent is extended or adjusted under 35 U.S.C. 154(b) by 912 days.

(21) Appl. No.: 12/956,842

(22) Filed: Nov. 30, 2010

(65) Prior Publication Data
US 2011/0130981 A1 Jun. 2, 2011

(30) Foreign Application Priority Data
Nov. 30, 2009 (CA) .................................. 2688870

(51) Int. Cl.
*G01R 31/00* (2006.01)
*G09G 3/32* (2006.01)
*G09G 3/00* (2006.01)

(52) U.S. Cl.
CPC ...... *G09G 3/3233* (2013.01); *G09G 2320/0285* (2013.01); *G09G 2320/043* (2013.01); *G09G 2300/0842* (2013.01); *G09G 3/006* (2013.01); *G09G 2320/029* (2013.01); *G09G 2320/0295* (2013.01)
USPC .......................................................... 702/58

(58) Field of Classification Search
USPC .......................................................... 702/58
See application file for complete search history.

(56) References Cited

U.S. PATENT DOCUMENTS

| 5,489,918 A | 2/1996 | Mosier |
| 6,271,825 B1 | 8/2001 | Greene et al. |

(Continued)

FOREIGN PATENT DOCUMENTS

| CA | 2 522 396 | 11/2004 |
| CN | 1448908 | 10/2003 |

(Continued)

OTHER PUBLICATIONS

Extended European Search Report mailed Apr. 16, 2013 which issued in corresponding European Patent Application No. 10832745.3 (10 pages).

(Continued)

*Primary Examiner* — Stephen Cherry
(74) *Attorney, Agent, or Firm* — Nixon Peabody LLP

(57) ABSTRACT

Methods and systems to provide baseline measurements for aging compensation for a display device are disclosed. An example display system has a plurality of active pixels and a reference pixel. Common input signals are provided to the reference pixel and the plurality of active pixels. The outputs of the reference pixel is measured and compared to the output of the active pixels to determine aging effects. The display system may also be tested applying a first known reference current to a current comparator with a second variable reference current and the output of a device under test such as one of the pixels. The variable reference current is adjusted until the second current and the output of the device under test is equivalent of the first current. The resulting current of the device under test is stored in a look up table for a baseline for aging measurements during the display system operation. The display system may also be tested to determine production flaws by determining anomalies such as short circuits in pixel components such as OLEDs and drive transistors.

10 Claims, 8 Drawing Sheets

(56) References Cited

U.S. PATENT DOCUMENTS

| | | | |
|---|---|---|---|
| 6,525,683 | B1 | 2/2003 | Gu |
| 6,806,497 | B2 | 10/2004 | Jo |
| 6,815,975 | B2 | 11/2004 | Nara et al. |
| 8,493,296 | B2 | 7/2013 | Ogawa |
| 2001/0024181 | A1 | 9/2001 | Kubota et al. |
| 2002/0014851 | A1 | 2/2002 | Tai et al. |
| 2002/0047565 | A1 | 4/2002 | Nara et al. |
| 2003/0071821 | A1 | 4/2003 | Sundahl et al. |
| 2003/0122813 | A1 | 7/2003 | Ishizuki et al. |
| 2003/0210256 | A1 | 11/2003 | Mori et al. |
| 2004/0108518 | A1 | 6/2004 | Jo |
| 2004/0263541 | A1 | 12/2004 | Takeuchi et al. |
| 2005/0280615 | A1 | 12/2005 | Cok et al. |
| 2006/0149493 | A1 | 7/2006 | Sambandan et al. |
| 2006/0284895 | A1 | 12/2006 | Marcu et al. |
| 2007/0075727 | A1 | 4/2007 | Nakano et al. |
| 2007/0076226 | A1 | 4/2007 | Klompenhouwer et al. |
| 2007/0236517 | A1 | 10/2007 | Kimpe |
| 2008/0150845 | A1 | 6/2008 | Ishii et al. |
| 2008/0231558 | A1* | 9/2008 | Naugler ............................ 345/76 |
| 2008/0252223 | A1 | 10/2008 | Toyoda et al. |
| 2009/0109142 | A1 | 4/2009 | Takahara |

FOREIGN PATENT DOCUMENTS

| | | |
|---|---|---|
| EP | 1 469 448 A | 10/2004 |
| JP | 2007065015 | 3/2007 |
| JP | 2008102335 | 5/2008 |
| WO | WO 03/058594 A1 | 7/2003 |
| WO | WO 2004/025615 A | 3/2004 |
| WO | WO 2005/022500 A | 3/2005 |
| WO | WO 2007/079572 | 7/2007 |

OTHER PUBLICATIONS

International Search Authority Search Report, Application No. PCT/IB2010/055486, Dated Apr. 19, 2011, 5 pages.

International Search Authority Written Opinion, Application No. PCT/IB2010/055486, Dated Apr. 19, 2011, 8 pages.

Ahnood et al.: "Effect of threshold voltage instability on field effect mobility in thin film transistors deduced from constant current measurements"; dated Aug. 2009.

Alexander et al.: "Pixel circuits and drive schemes for glass and elastic AMOLED displays"; dated Jul. 2005 (9 pages).

Alexander et al.: "Unique Electrical Measurement Technology for Compensation, Inspection, and Process Diagnostics of AMOLED HDTV"; dated May 2010 (4 pages).

Arokia Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.

Ashtiani et al.: "AMOLED Pixel Circuit With Electronic Compensation of Luminance Degradation"; dated Mar. 2007 (4 pages).

Chaji et al.: "A Current-Mode Comparator for Digital Calibration of Amorphous Silicon AMOLED Displays"; dated Jul. 2008 (5 pages).

Chaji et al.: "A fast settling current driver based on the CCII for AMOLED displays"; dated Dec. 2009 (6 pages).

Chaji et al.: "A Low-Cost Stable Amorphous Silicon AMOLED Display with Full V~T- and V~O~L~E~D Shift Compensation"; dated May 2007 (4 pages).

Chaji et al.: "A low-power driving scheme for a-Si:H active-matrix organic light-emitting diode displays"; dated Jun. 2005 (4 pages).

Chaji et al.: "A low-power high-performance digital circuit for deep submicron technologies"; dated Jun. 2005 (4 pages).

Chaji et al.: "A novel a-Si:H AMOLED pixel circuit based on short-term stress stability of a-Si:H TFTs"; dated Oct. 2005 (3 pages).

Chaji et al.: "A Novel Driving Scheme and Pixel Circuit for AMOLED Displays"; dated Jun. 2006 (4 pages).

Chaji et al.: "A novel driving scheme for high-resolution large-area a-Si:H AMOLED displays"; dated Aug. 2005 (4 pages).

Chaji et al.: "A Stable Voltage-Programmed Pixel Circuit for a-Si:H AMOLED Displays"; dated Dec. 2006 (12 pages).

Chaji et al.: "A Sub-μA fast-settling current-programmed pixel circuit for AMOLED displays"; dated Sep. 2007.

Chaji et al.: "An Enhanced and Simplified Optical Feedback Pixel Circuit for AMOLED Displays"; dated Oct. 2006.

Chaji et al.: "Compensation technique for DC and transient instability of thin film transistor circuits for large-area devices"; dated Aug. 2008.

Chaji et al.: "Driving scheme for stable operation of 2-TFT a-Si AMOLED pixel"; dated Apr. 2005 (2 pages).

Chaji et al.: "Dynamic-effect compensating technique for stable a-Si:H AMOLED displays"; dated Aug. 2005 (4 pages).

Chaji et al.: "Electrical Compensation of OLED Luminance Degradation"; dated Dec. 2007 (3 pages).

Chaji et al.: "eUTDSP: a design study of a new VLIW-based DSP architecture"; dated May 2003 (4 pages).

Chaji et al.: "Fast and Offset-Leakage Insensitive Current-Mode Line Driver for Active Matrix Displays and Sensors"; dated Feb. 2009 (8 pages).

Chaji et al.: "High Speed Low Power Adder Design With a New Logic Style: Pseudo Dynamic Logic (SDL)"; dated Oct. 2001 (4 pages).

Chaji et al.: "High-precision, fast current source for large-area current-programmed a-Si flat panels"; dated Sep. 2006 (4 pages).

Chaji et al.: "Low-Cost AMOLED Television with IGNIS Compensating Technology"; dated May 2008 (4 pages).

Chaji et al.: "Low-Cost Stable a-Si:H AMOLED Display for Portable Applications"; dated Jun. 2006 (4 pages).

Chaji et al.: "Low-Power Low-Cost Voltage-Programmed a-Si:H AMOLED Display"; dated Jun. 2008 (5 pages).

Chaji et al.: "Merged phototransistor pixel with enhanced near infrared response and flicker noise reduction for biomolecular imaging"; dated Nov. 2008 (3 pages).

Chaji et al.: "Parallel Addressing Scheme for Voltage-Programmed Active-Matrix OLED Displays"; dated May 2007 (6 pages).

Chaji et al.: "Pseudo dynamic logic (SDL): a high-speed and low-power dynamic logic family"; dated 2002 (4 pages).

Chaji et al.: "Stable a-Si:H circuits based on short-term stress stability of amorphous silicon thin film transistors"; dated May 2006 (4 pages).

Chaji et al.: "Stable Pixel Circuit for Small-Area High- Resolution a-Si:H AMOLED Displays"; dated Oct. 2008 (6 pages).

Chaji et al.: "Stable RGBW AMOLED display with OLED degradation compensation using electrical feedback"; dated Feb. 2010 (2 pages).

Chaji et al.: "Thin-Film Transistor Integration for Biomedical Imaging and AMOLED Displays"; dated 2008 (177 pages).

European Search Report for European Application No. EP 06 72 1798 dated Nov. 12, 2009 (2 pages).

Jafarabadiashtiani et al.: "A New Driving Method for a-Si AMOLED Displays Based on Voltage Feedback"; dated 2005 (4 pages).

Joon-Chul Goh et al., "A New a-Si:H Thin-Film Transistor Pixel Circuit for Active-Matrix Organic Light-Emitting Diodes", IEEE Electron Device Letters, Vol, 24, No. 9, Sep. 2003, pp. 583-585.

Lee et al.: "Ambipolar Thin-Film Transistors Fabricated by PECVD Nanocrystalline Silicon"; dated 2006 (6 pages).

Ma E Y et al.: "organic light emitting diode/thin film transistor integration for foldable displays" dated Sep. 15, 1997(4 pages).

Matsueda y et al.: "35.1: 2.5-in. AMOLED with Integrated 6-bit Gamma Compensated Digital Data Driver"; dated May 2004.

Nathan A. et al., "Thin Film imaging technology on glass and plastic" ICM 2000, proceedings of the 12 international conference on microelectronics, dated Oct. 31, 2001 (4 pages).

Nathan et al.: "Backplane Requirements for Active Matrix Organic Light Emitting Diode Displays"; dated 2006 (16 pages).

Nathan et al.: "Call for papers second international workshop on compact thin-film transistor (TFT) modeling for circuit simulation"; dated Sep. 2009 (1 page).

(56) References Cited

OTHER PUBLICATIONS

Nathan et al.: "Driving schemes for a-Si and LTPS AMOLED displays"; dated Dec. 2005 (11 pages).
Nathan et al.: "Invited Paper: a-Si for AMOLED—Meeting the Performance and Cost Demands of Display Applications (Cell Phone to HDTV)"; dated 2006 (4 pages).
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Stewart M. et al., "polysilicon TFT technology for active matrix oled displays" IEEE transactions on electron devices, vol. 48, No. 5, dated May 2001 (7 pages).
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.

* cited by examiner

SYSTEM AND METHODS FOR AGING COMPENSATION IN AMOLED DISPLAYS

PRIORITY CLAIM

This application claims priority to Canadian Application No. 2,688,870, which was filed Nov. 30, 2009.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention generally relates to active matrix organic light emitting device (AMOLED) displays, and particularly determining aging conditions requiring compensation for the pixels of such displays.

BACKGROUND

Currently, active matrix organic light emitting device ("AMOLED") displays are being introduced. The advantages of such displays include lower power consumption, manufacturing flexibility and faster refresh rate over conventional liquid crystal displays. In contrast to conventional liquid crystal displays, there is no backlighting in an AMOLED display as each pixel consists of different colored OLEDs emitting light independently. The OLEDs emit light based on current supplied through a drive transistor. The drive transistor is typically a thin film transistor (TFT). The power consumed in each pixel has a direct relation with the magnitude of the generated light in that pixel.

The drive-in current of the drive transistor determines the pixel's OLED luminance. Since the pixel circuits are voltage programmable, the spatial-temporal thermal profile of the display surface changing the voltage-current characteristic of the drive transistor impacts the quality of the display. The rate of the short-time aging of the thin film transistor devices is also temperature dependent. Further the output of the pixel is affected by long term aging of the drive transistor. Proper corrections can be applied to the video stream in order to compensate for the unwanted thermal-driven visual effects. Long term aging of the drive transistor may be properly determined via calibrating the pixel against stored data of the pixel to determine the aging effects. Accurate aging data is therefore necessary throughout the lifetime of the display device.

Currently, displays having pixels are tested prior to shipping by powering all the pixels at full brightness. The array of pixels is then optically inspected to determine whether all of the pixels are functioning. However, optical inspection fails to detect electrical faults that may not manifest themselves in the output of the pixel. The baseline data for pixels is based on design parameters and characteristics of the pixels determined prior to leaving the factory but this does not account for the actual physical characteristics of the pixels in themselves.

Various compensation systems use a normal driving scheme where a video frame is always shown on the panel and the OLED and TFT circuitries are constantly under electrical stress. Moreover, pixel calibration (data replacement and measurement) of each sub-pixel occurs during each video frame by changing the grayscale value of the active sub-pixel to a desired value. This causes a visual artifact of seeing the measured sub-pixel during the calibration. It may also worsen the aging of the measured sub-pixel, since the modified grayscale level is kept on the sub-pixel for the duration of the entire frame.

Therefore, there is a need for techniques to provide accurate measurement of the display temporal and spatial information and ways of applying this information to improve display uniformity in an AMOLED display. There is also a need to determine baseline measurements of pixel characteristics accurately for aging compensation purposes.

SUMMARY

Aspects of the present disclosure include a voltage-programmed display panel allowing measurement of effects on pixels in the panel. The panel includes a plurality of active pixels forming the display panel to display an image under an operating condition. The active pixels are each coupled to a supply line and a programming line. A reference pixel is coupled to the supply line and the programming line. The reference pixel has a controlled condition independent of the operating condition of the active pixels. A controller is coupled to each of the plurality of active pixels and reference pixel. The controller causes a test voltage to be applied to the plurality of active pixels and the reference pixel. The controller compares an output of the reference pixel in comparison with the output of one of the plurality of active pixels.

Another example is a method of determining a baseline value for aging effects of a transistor based display including a plurality of light emitting device pixels. Each of the pixels has a programming voltage input to determine brightness. A set programming voltage is input to a device under test of the display. An output current is generated based on the set programming voltage input. A first reference current and a variable second reference current is compared with the output current via a current comparator until the first reference current and the combination of the second reference current and the output current is the same. The output current value based on the value of the second reference current is determined when the combination of the second reference current and the output current is the same as the first reference current.

Another example is a method for determining data for production of a display device having a plurality of pixels. A test signal is applied to each of the plurality of pixels. Voltage and current characteristics are measured for each of the pixels. It is determined whether anomalies exist for each of the pixels. Anomaly data is read from the pixels with anomalies. The anomaly data from the pixels demonstrating anomalies is stored.

Another example is a display system including an array of pixels to display images. A memory includes characteristic data. A profile generator is coupled to the memory to generate a plurality of luminance profiles based on the characteristic data. A controller is coupled to the profile generator and the array of pixels to change the luminance of the array of pixels according to a selected one of the plurality of luminance profiles.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
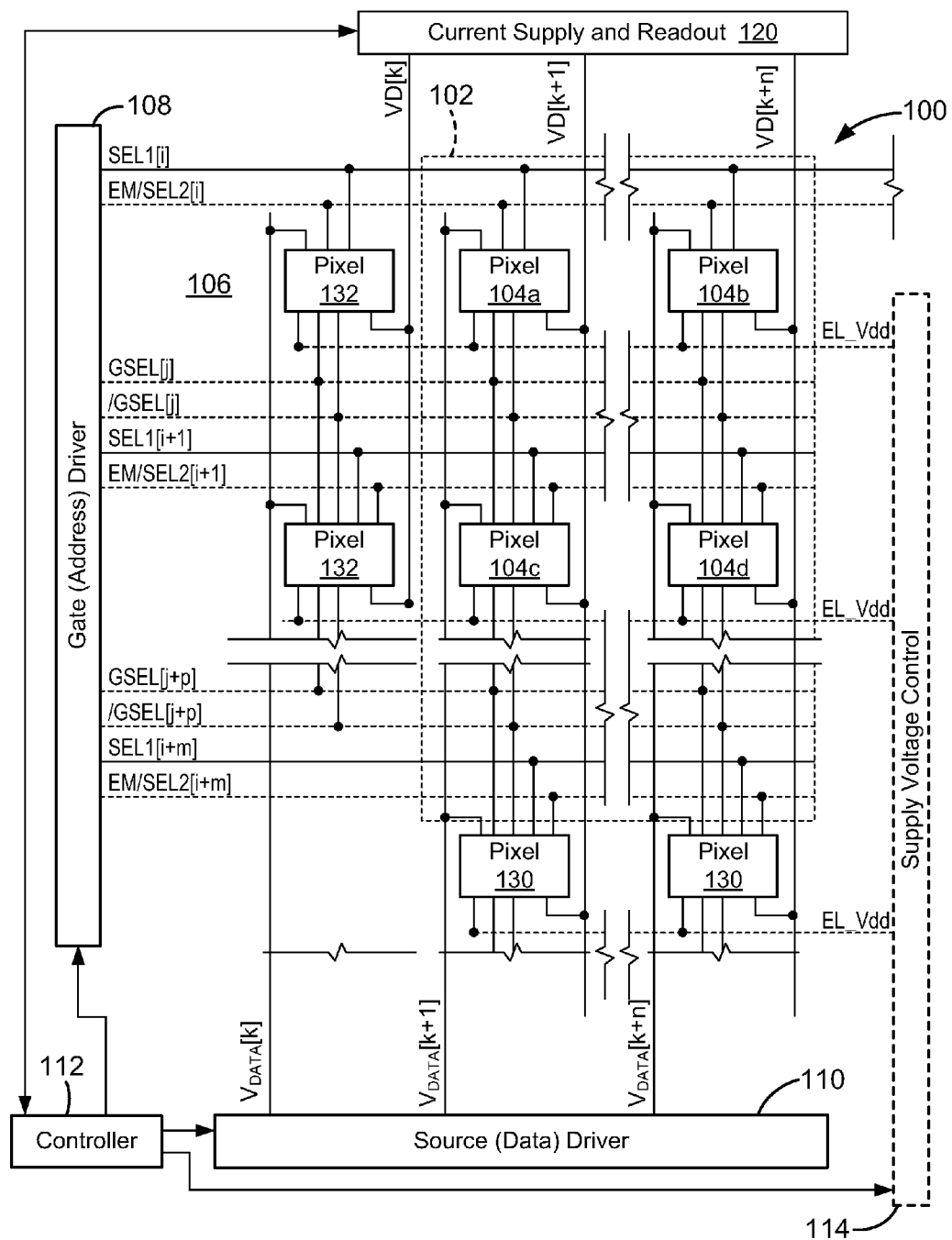
FIG. 1 is a block diagram of a AMOLED display with reference pixels to correct data for parameter compensation control.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 is an electronic display system 100 having an active matrix area or pixel array 102 in which an array of active pixels 104a-d are arranged in a row and column configuration. For ease of illustration, only two rows and columns are shown. External to the active matrix area which is the pixel array 102 is a peripheral area 106 where peripheral circuitry for driving and controlling the area of the pixel array 102 are disposed. The peripheral circuitry includes a gate or address driver circuit 108, a source or data driver circuit 110, a controller 112, and an optional supply voltage (e.g., Vdd) driver 114. The controller 112 controls the gate, source, and supply voltage drivers 108, 110, 114. The gate driver 108, under control of the controller 112, operates on address or select lines SEL[i], SEL[i+1], and so forth, one for each row of pixels 104 in the pixel array 102. In pixel sharing configurations described below, the gate or address driver circuit 108 can also optionally operate on global select lines GSEL[j] and optionally /GSEL[j], which operate on multiple rows of pixels 104a-d in the pixel array 102, such as every two rows of pixels 104a-d. The source driver circuit 110, under control of the controller 112, operates on voltage data lines Vdata[k], Vdata[k+1], and so forth, one for each column of pixels 104a-d in the pixel array 102. The voltage data lines carry voltage programming information to each pixel 104 indicative of brightness of each light emitting device in the pixel 104. A storage element, such as a capacitor, in each pixel 104 stores the voltage programming information until an emission or driving cycle turns on the light emitting device. The optional supply voltage driver 114, under control of the controller 112, controls a supply voltage (EL_Vdd) line, one for each row of pixels 104a-d in the pixel array 102.

The display system 100 may also include a current source circuit, which supplies a fixed current on current bias lines. In some configurations, a reference current can be supplied to the current source circuit. In such configurations, a current source control controls the timing of the application of a bias current on the current bias lines. In configurations in which the reference current is not supplied to the current source circuit, a current source address driver controls the timing of the application of a bias current on the current bias lines.

As is known, each pixel 104a-d in the display system 100 needs to be programmed with information indicating the brightness of the light emitting device in the pixel 104a-d. A frame defines the time period that includes a programming cycle or phase during which each and every pixel in the display system 100 is programmed with a programming voltage indicative of a brightness and a driving or emission cycle or phase during which each light emitting device in each pixel is turned on to emit light at a brightness commensurate with the programming voltage stored in a storage element. A frame is thus one of many still images that compose a complete moving picture displayed on the display system 100. There are at least two schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system 100 are programmed first, and all of the frames are driven row-by-row. Either scheme can employ a brief vertical blanking time at the beginning or end of each frame during which the pixels are neither programmed nor driven.

The components located outside of the pixel array 102 may be disposed in a peripheral area 106 around the pixel array 102 on the same physical substrate on which the pixel array 102 is disposed. These components include the gate driver 108, the source driver 110 and the optional supply voltage control 114. Alternately, some of the components in the peripheral area can be disposed on the same substrate as the pixel array 102 while other components are disposed on a different substrate, or all of the components in the peripheral area can be disposed on a substrate different from the substrate on which the pixel array 102 is disposed. Together, the gate driver 108, the source driver 110, and the supply voltage control 114 make up a display driver circuit. The display driver circuit in some configurations may include the gate driver 108 and the source driver 110 but not the supply voltage control 114.

The display system 100 further includes a current supply and readout circuit 120, which reads output data from data output lines, VD [k], VD [k+1], and so forth, one for each column of pixels 104a, 104c in the pixel array 102. A set of column reference pixels 130 is fabricated on the edge of the pixel array 102 at the end of each column such as the column of pixels 104a and 104c. The column reference pixels 130 also may receive input signals from the controller 112 and output data signals to the current supply and readout circuit 120. The column reference pixels 130 include the drive transistor and an OLED but are not part of the pixel array 102 that displays images. As will be explained below, the column reference pixels 130 are not driven for most of the programming cycle because they are not part of the pixel array 102 to display images and therefore do not age from the constant application of programming voltages as compared to the pixels 104a and 104c. Although only one column reference pixel 130 is shown in FIG. 1, it is to be understood that there may be any number of column reference pixels although two to five such reference pixels may be used for each column of pixels in this example. Each row of pixels in the array 102 also includes row reference pixels 132 at the ends of each row of pixels 104a-d such as the pixels 104a and 104b. The row reference pixels 132 include the drive transistor and an OLED but are not part of the pixel array 102 that displays images. As will be explained the row reference pixels 132 have the function of providing a reference check for luminance curves for the pixels which were determined at the time of production.

Figure 2A:
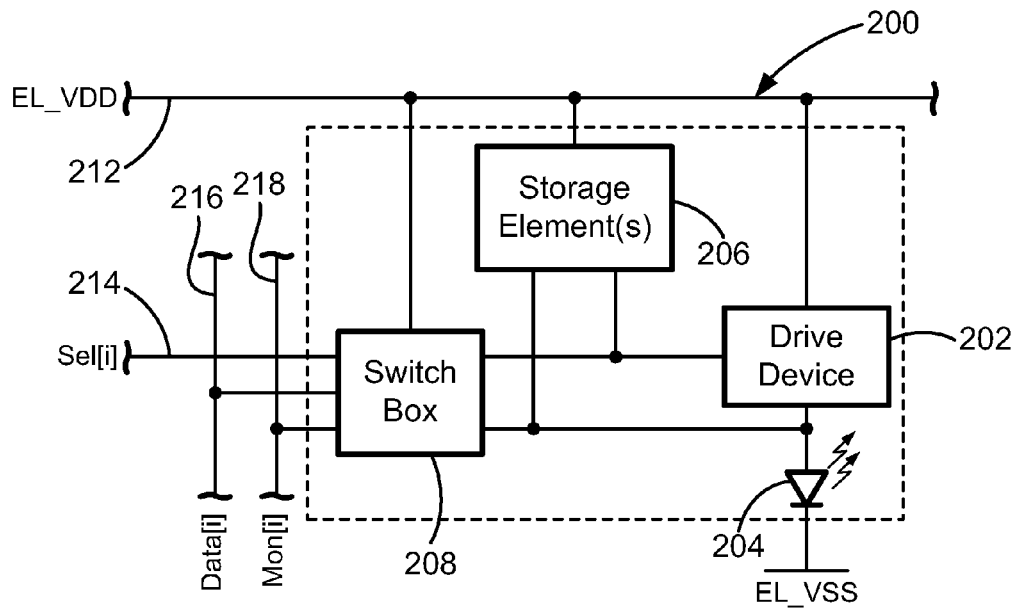
FIG. 2A is a block diagram of a driver circuit of one of the pixels of the AMOLED that may be tested for aging parameters.

FIG. 2A shows a block diagram of a driver circuit 200 for the pixel 104 in FIG. 1. The driver circuit 200 includes a drive device 202, an organic light emitting device ("OLED") 204, a storage element 206, and a switching device 208. A voltage source 212 is coupled to the drive transistor 206. A select line 214 is coupled to the switching device to activate the driver circuit 200. A data line 216 allows a programming voltage to be applied to the drive device 202. A monitoring line 218 allows outputs of the OLED 204 and or the drive device 202 to be monitored. Alternatively, the monitor line 218 and the data line 216 may be merged into one line (i.e. Data/Mon) to carry out both the programming and monitoring functions through that single line.

Figure 2B:
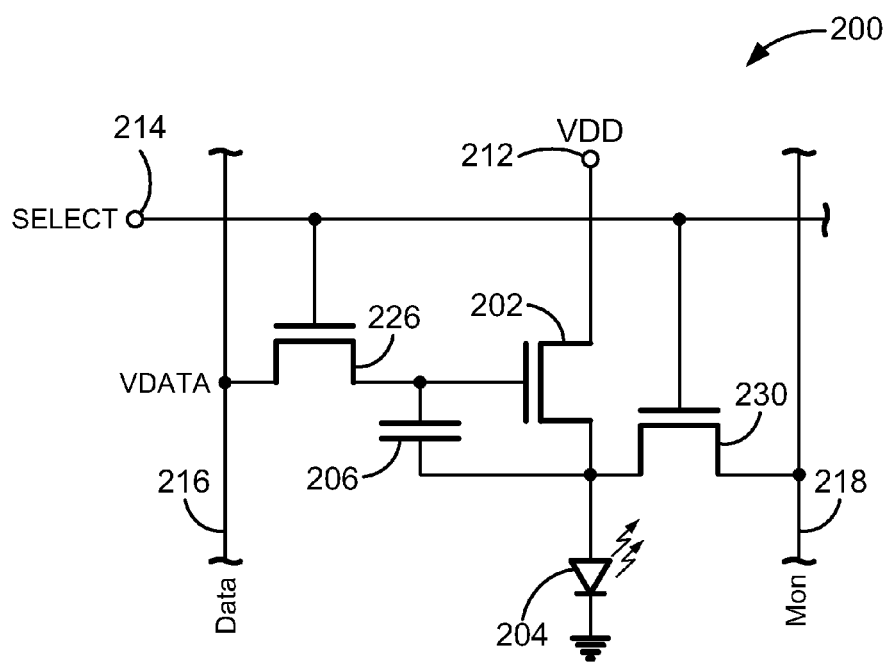
FIG. 2B is a circuit diagram of a driver circuit of one of the pixels of the AMOLED.

FIG. 2B shows one example of a circuit to implement the driver circuit 200 in FIG. 2A. As shown in FIG. 2B, the drive device 202 is a drive transistor which is a thin film transistor in this example that is fabricated from amorphous silicon. The storage element 206 is a capacitor in this example. The switching device 208 includes a select transistor 226 and a monitoring transistor 230 that switch the different signals to the drive circuit 200. The select line 214 is coupled to the select transistor 226 and the monitoring transistor 230. During the readout time, the select line 214 is pulled high. A programming voltage may be applied via the programming voltage input line 216. A monitoring voltage may be read from the monitoring line 218 that is coupled to the monitoring transistor 230. The signal to the select line 214 may be sent in parallel with the pixel programming cycle. As will be explained below, the driver circuit 200 may be periodically tested by applying reference voltage to the gate of the drive transistor.

There are several techniques for extracting electrical characteristics data from a device under test (DUT) such as the display system 100. The device under test (DUT) can be any material (or device) including (but not limited to) a light emitting diode (LED), or OLED. This measurement may be effective in determining the aging (and/or uniformity) of an OLED in a panel composed of an array of pixels such as the array 102 in FIG. 1. This extracted data can be stored in lookup tables as raw or processed data in memory in the controller 112 in FIG. 1. The lookup tables may be used to compensate for any shift in the electrical parameters of the backplane (e.g., threshold voltage shift) or OLED (e.g., shift in the OLED operating voltage). Despite using an OLED display in FIG. 1 in these examples, the techniques described herein may be applied to any display technology including but not limited to OLED, liquid crystal displays (LCD), light emitting diode displays, or plasma displays. In the case of OLED, the electrical information measured may provide an indication of any aging that may have occurred.

Current may be applied to the device under test and the output voltage may be measured. In this example, the voltage is measured with an analog to digital converter (ADC). A higher programming voltage is necessary for a device such as an OLED that ages as compared to the programming voltage for a new OLED for the same output. This method gives a direct measurement of that voltage change for the device under test. Current flow can be in any direction but the current is generally fed into the device under test (DUT) for illustration purposes.

Figure 3:
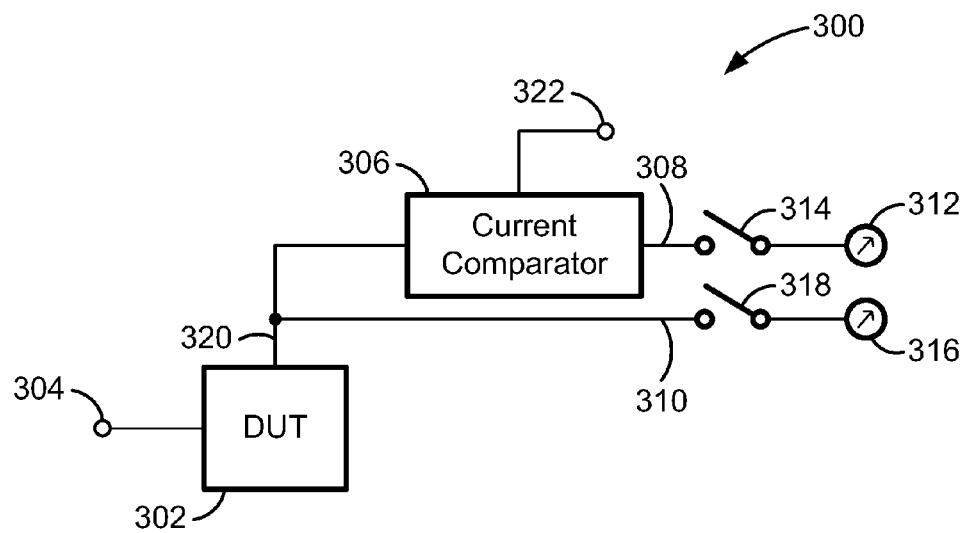
FIG. 3 is a block diagram for a system to determine one of the baseline aging parameters for a device under test.

FIG. 3 is a block diagram of a comparison system 300 that may be used to determine a baseline value for a device under test 302 to determine the effects of aging on the device under test 302. The comparison system uses two reference currents to determine the baseline current output of the device under test 302. The device under test 302 may be either the drive transistor such as the drive transistor 202 in FIG. 2B or an OLED such as the OLED 204 in FIG. 2B. Of course other types of display devices may also be tested using the system shown in FIG. 3. The device under test 302 has a programming voltage input 304 that is held at a constant level to output a current. A current comparator 306 has a first reference current input 308 and a second reference current input 310. The reference current input 308 is coupled to a first reference current source 312 via a switch 314. The second current input 310 of the comparator 306 is coupled to a second reference current source 316 via a switch 318. An output 320 of the device under test 302 is also coupled to the second current input 310. The current comparator 306 includes a comparison output 322.

By keeping the voltage to the input 304 constant, the output current of the device under test 302 is also constant. This current depends on the characteristics of the device under test 302. A constant current is established for the first reference current from the first reference current source 312 and via the switch 314 the first reference current is applied to the first input 308 of the current comparator 306. The second reference current is adjusted to different levels with each level being connected via the switch 318 to the second input 310 of the comparator 306. The second reference current is combined with the output current of the device under test 302. Since the first and second reference current levels are known, the difference between the two reference current levels from the output 322 of the current comparator 306 is the current level of the device under test 302. The resulting output current is stored for the device under test 302 and compared with the current measured based on the same programming voltage level periodically during the lifetime operation of the device under test 302 to determine the effects of aging.

The resulting determined device current may be stored in look up tables for each device in the display. As the device under test 302 ages, the current will change from the expected level and therefore the programming voltage may be changed to compensate for the effects of aging based on the base line current determined through the calibration process in FIG. 3.

Figure 4A:
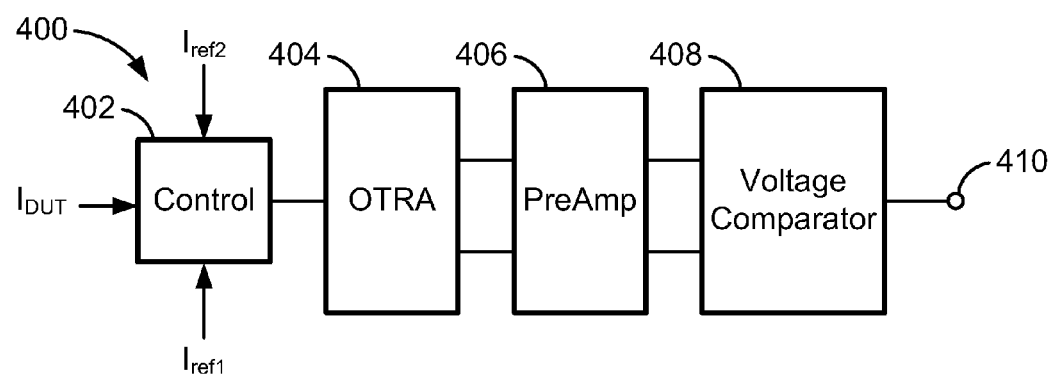
FIG. 4A is a block diagram of the current comparator in FIG. 3 for comparison of a reference current level to the device under test for use in aging compensation.

FIG. 4A is a block diagram of a current comparator circuit 400 that may be used to compare reference currents with a device under test 302 such as in FIG. 3. The current comparator circuit 400 has a control junction 402 that allows various current inputs such as two reference currents and the current of the device under test such as the pixel driver circuit 200 in FIG. 1. The current may be a positive current when the current of the drive transistor 202 is compared or negative when the current of the OLED 204 is compared. The current comparator circuit 400 also includes an operational trans-resistance amplifier circuit 404, a preamplifier 406 and a voltage comparator circuit 408 that produces a voltage output 410. The combined currents are input to the operational trans-resistance amplifier circuit 404 and converted to a voltage. The voltage is fed to the preamplifier and the voltage comparator circuit 408 determines whether the difference in currents is positive or negative and outputs a respective one or a zero value.

Figure 4B:
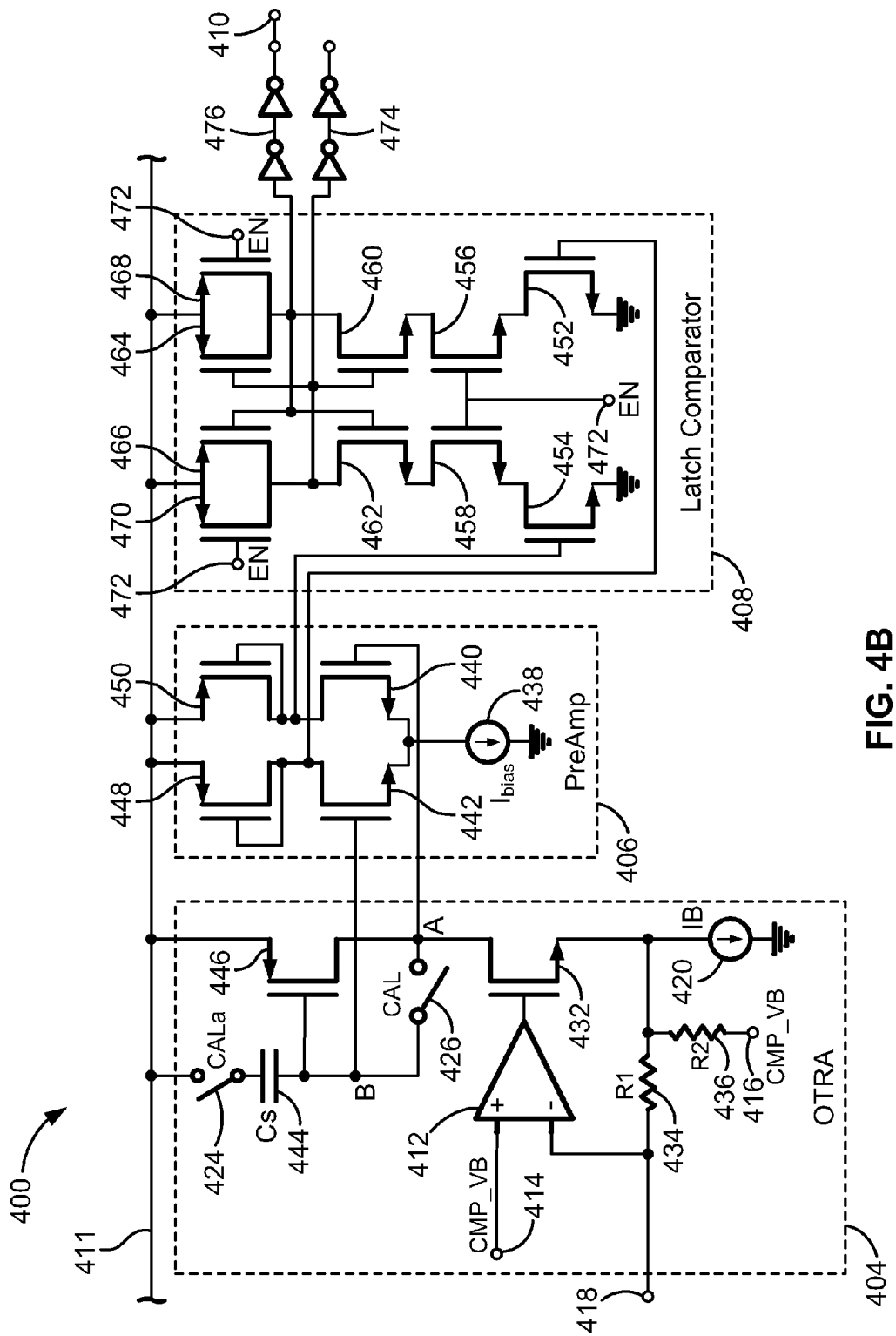
FIG. 4B is a detailed circuit diagram of the current comparator in FIG. 4A.

FIG. 4B is a circuit diagram of the components of the example current comparator system 400 in FIG. 4A that may be used to compare the currents as described in the process in FIG. 3 for a device under test such as the device 302. The operational trans-resistance amplifier circuit 404 includes an operational amplifier 412, a first voltage input 414 (CMP_VB), a second voltage input 416 (CMP_VB), a current input 418, and a bias current source 420. The operational trans-resistance amplifier circuit 404 also includes two calibration switches 424 and 426. As will be explained below, various currents such as the current of the device under test 302, a variable first reference current and a fixed second reference current as shown in FIG. 3 are coupled to the current input 418 in this example. Of course, the fixed second reference current may be set to zero if desired.

The first reference current input is coupled to the negative input of the operational amplifier 412. The negative input of the operational amplifier 412 is therefore coupled to the output current of the device under test 302 in FIG. 3 as well as one or two reference currents. The positive input of the operational amplifier 412 is coupled to the first voltage input 414. The output of the operational amplifier 412 is coupled to the gate of a transistor 432. A resistor 434 is coupled between the negative input of the operational amplifier 412 and the source of the transistor 432. A resistor 436 is coupled between the source of the transistor 432 and the second voltage input 416.

The drain of the transistor 432 is coupled directly to the drain of a transistor 446 and via the calibration switch 426 to the gate. A sampling capacitor 444 is coupled between the gate of the transistor 446 and a voltage supply rail 411 through a switch 424. The source of the 446 is also coupled to the supply rail 411. The drain and gate of the transistor 446 are coupled to the gate terminals of transistors 440 and 442, respectively. The sources of the transistors 440 and 442 are tied together and coupled to a bias current source 438. The drains of the transistors 442 and 440 are coupled to respective transistors 448 and 450 which are wired in diode-connected configuration to the supply voltage rail 411. As shown in FIG. 4B, the transistors 440, 442, 448 and 450 and the bias current source 438 are parts of the preamplifier 406

The drains of the transistors 442 and 440 are coupled to the gates of the respective transistors 452 and 454. The drains of the transistors 452 and 454 are coupled to the transistors 456 and 458. The drains of the transistors 456 and 458 are coupled to the respective sources of the transistors 460 and 462. The drain and gate terminals of the transistors 460 and 462 are coupled to the respective drain and gate terminals of the transistors 464 and 466. The source terminals of the transistors 464 and 466 are coupled to the supply voltage rail 411. The sources and drains of the transistors 464 and 466 are tied to the respective sources and drains of transistors 468 and 470. The gates of the transistors 456 and 458 are tied to an enable input 472. The enable input 472 is also tied to the gates of dual transistors 468 and 470.

A buffer circuit 474 is coupled to the drain of the transistor 462 and the gate of the transistor 460. The output voltage 410 is coupled to a buffer circuit 476 which is coupled to the drain of the transistor 460 and the gate of the transistor 462. The buffer circuit 474 is used to balance the buffer 476. The transistors 452, 454, 456, 458, 460, 462, 464, 466, 468 and 470 and the buffer circuits 474 and 476 make up the voltage comparator circuit 408.

The current comparator system 400 may be based on any integrated circuit technology including but not limited to CMOS semiconductor fabrication. The components of the current comparator system 400 are CMOS devices in this example. The values for the input voltages 414 and 416 are determined for a given reference current level from the first current input 418 ($I_{ref}$). In this example, the voltage levels for both the input voltages 414 and 416 are the same. The voltage inputs 414 and 416 to the operational amplifier 412 may be controlled using a digital to analog converter (DAC) device which is not shown in FIG. 4. Level shifters can also be added if the voltage ranges of the DACs are insufficient. The bias current may originate from a voltage controlled current source such as a transimpedance amplifier circuit or a transistor such as a thin film transistor.

Figure 4C:
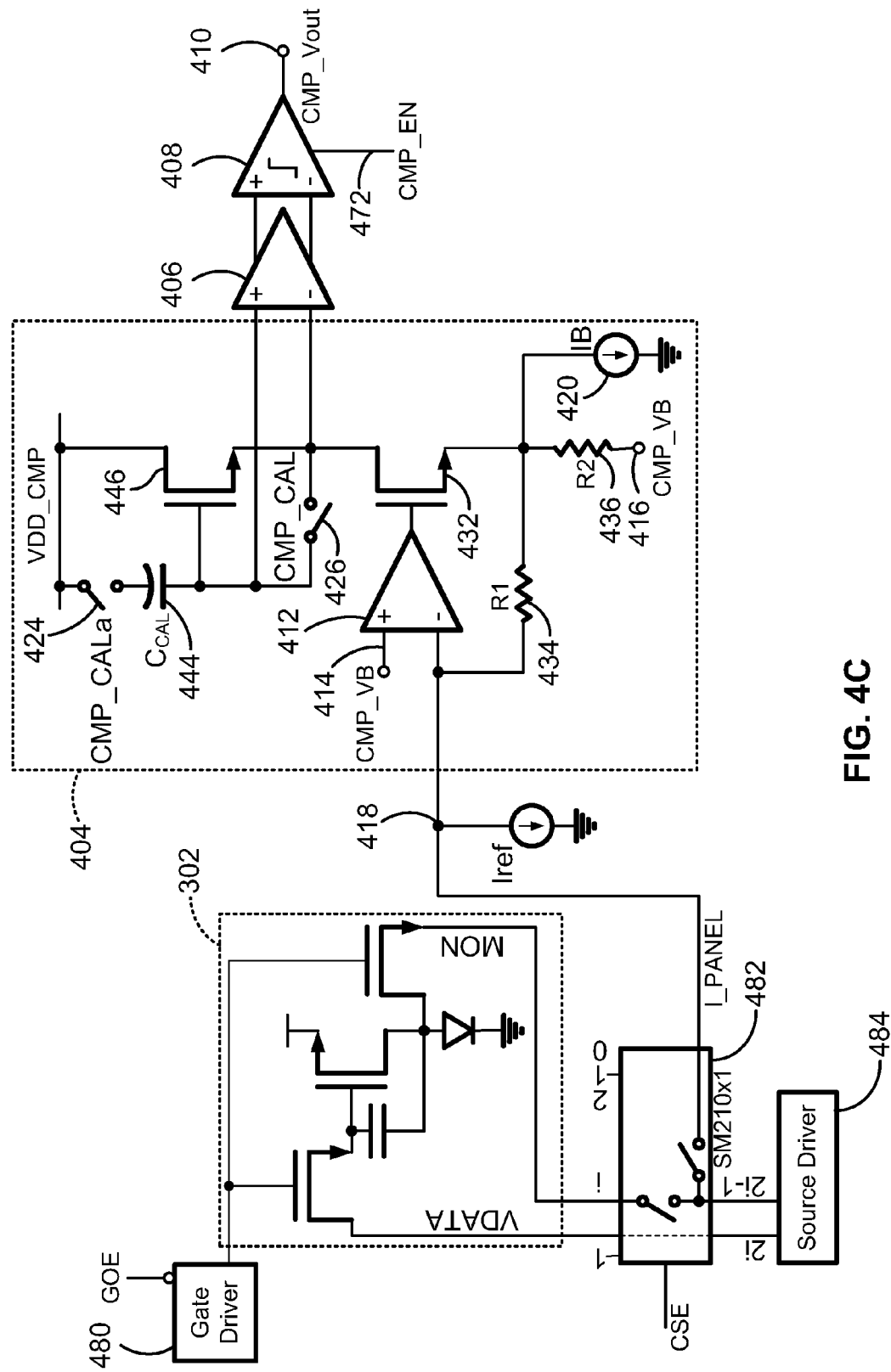
FIG. 4C is a detailed block diagram of the device under test in FIG. 3 coupled to the current comparator in FIG. 4A.

FIG. 4C shows a detailed block diagram of one example of a test system such as the system 300 shown in FIG. 3. The test system in FIG. 4C is coupled to a device under test 302 which may be a pixel driver circuit such as the pixel driver circuit 200 shown in FIG. 2. In this example, all of the driver circuits for a panel display are tested. A gate driver circuit 480 is coupled to the select lines of all of the driver circuits. The gate driver circuit 480 includes an enable input, which in this example enables the device under test 302 when the signal on the input is low.

The device under test 302 receives a data signal from a source driver circuit 484. The source circuit 484 may be a source driver such as the source driver 120 in FIG. 1. The data signal is a programming voltage of a predetermined value. The device under test 302 outputs a current on a monitoring line when the gate driver circuit 480 enables the device. The output of the monitoring line from the device under test 302 is coupled to an analog multiplexer circuit 482 that allows multiple devices to be tested. In this example, the analog multiplexer circuit 482 allows multiplexing of 210 inputs, but of course any number of inputs may be multiplexed.

The signal output from the device under test 302 is coupled to the reference current input 418 of the operational trans-resistance amplifier circuit 404. In this example a variable reference current source is coupled to the current input 418 as described in FIG. 3. In this example, there is no fixed reference current such as the first reference current source in FIG. 3. The value of first reference current source in FIG. 3 in this example is therefore considered to be zero.

Figure 5A:
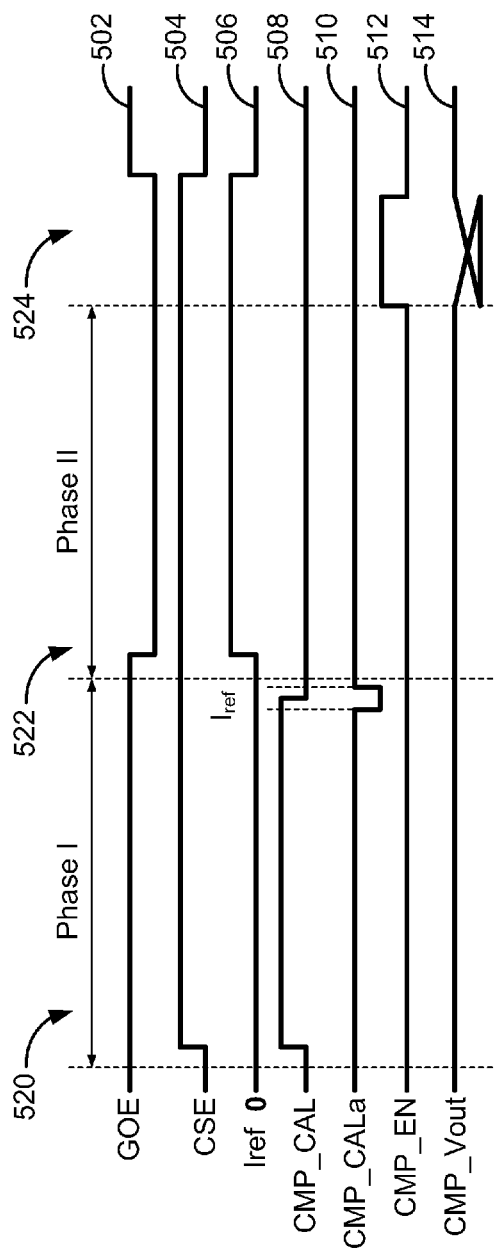
FIG. 5A is a signal timing diagram of the signals for the current comparator in FIGS. 3-4 in the process of determining the current output of a device under test.

FIG. 5A is a timing diagram of the signals for the current comparator shown in FIGS. 4A-4C. The timing diagram in FIG. 5A shows a gate enable signal 502 to the gate driver 480 in FIG. 4C, a CSE enable signal 504 that is coupled to the analog multiplexer 482, a current reference signal 506 that is produced by a variable reference current source that is set at a predetermined level for each iteration of the test process and coupled to the current input 418, a calibration signal 508 that controls the calibration switch 426, a calibration signal 510 that controls the calibration switch 424, a comparator enable signal 512 that is coupled to the enable input 472, and the output voltage 514 over the output 410. The CSE enable signal 504 is kept high to ensure that any leakage on the monitoring line of the device under test 302 is eliminated in the final current comparison.

In a first phase 520, the gate enable signal 502 is pulled high and therefore the output of the device under test 302 in FIG. 4C is zero. The only currents that are input to the current comparator 400 are therefore leakage currents from the monitoring line of the device under test 302. The output of the reference current 506 is also set to zero such that the optimum quiescent condition of the transistors 432 and 436 in FIGS. 4B and 4C is minimally affected only by line leakage or the offset of the readout circuitry. The calibration signal 508 is set high causing the calibration switch 426 to close. The calibration signal 510 is set high to cause the calibration switch 424 to close. The comparator enable signal 512 is set low and therefore the output from the voltage comparator circuit 408 is reset to a logical one. The leakage current is therefore input to the current input 418 and a voltage representing the leakage current of the monitoring line on the panel is stored on the capacitor 444.

In a second phase 522, the gate enable signal 502 is pulled low and therefore the output of the device under test 302 produces an unknown current at a set programming voltage input from the source circuit 484. The current from the device under test 302 is input through the current input 418 along with the reference current 506 which is set at a first predetermined value and opposite the direction of the current of the device under test. The current input 418 therefore is the difference between the reference current 506 and the current from the device under test 302. The calibration signal 510 is momentarily set low to open the switch 424. The calibration signal 508 is then set low and therefore the switch 426 is opened. The calibration signal 510 to the switch 424 is then set high to close the switch 424 to stabilize the voltage on the gate terminal of the transistor 446. The comparator enable signal 512 remains low and therefore there is no output from the voltage comparator circuit 408.

In a third phase 524, the comparator enable signal 512 is pulled high and the voltage comparator 408 produces an output on the voltage output 410. In this example, a positive voltage output logical one for the output voltage signal 514 indicates a positive current therefore showing that the current of the device under test 302 is greater than the predetermined reference current. A zero voltage on the voltage output 410 indicates a negative current showing that the current of the device under test 302 is less than the predetermined level of the reference current. In this manner, any difference between the current of the device under test and the reference current is amplified and detected by the current comparator circuit 400. The value of the reference current is then shifted based on the result to a second predetermined level and the phases 520, 522 and 524 are repeated. Adjusting the reference current allows the comparator circuit 400 to be used by the test system to determine the current output by the device under test 302.

Figure 5B:
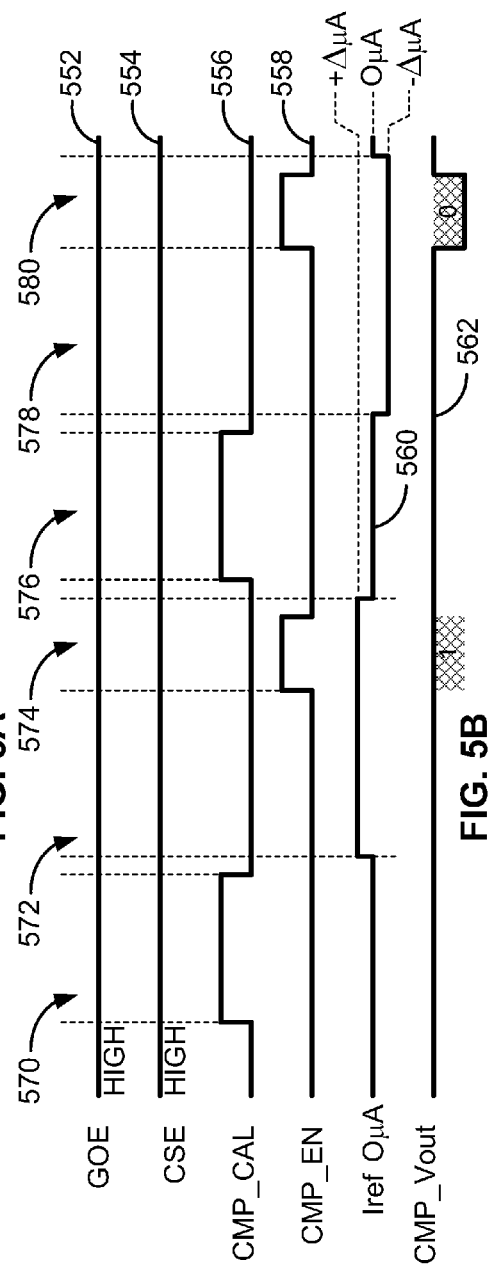
FIG. 5B is a signal timing diagram of the signals for calibrating the bias current for the current comparator in FIGS. 3-4.

FIG. 5B is a timing diagram of the signals applied to the test system shown in FIG. 4C in order to determine an optimal bias current value for the bias current source 420 in FIG. 4B for the operational trans-resistance amplifier circuit 404. In order to achieve the maximum signal-to-noise ratio (SNR) for the current comparator circuit 400 it is essential to calibrate the current comparator. The calibration is achieved by means of fine tuning of the bias current source 420. The optimum bias current level for the bias current source 420 minimizes the noise power during the measurement of a pixel which is also a function of the line leakage. Accordingly, it is required to capture the line leakage during the calibration of the current comparator.

The timing diagram in FIG. 5B shows a gate enable signal 552 to the gate driver 480 in FIG. 4C, a CSE enable signal 554 that is coupled to the analog multiplexer 482, a current reference signal 556 that is produced by a variable reference current source that is set at a predetermined level for each iteration of the calibration process and coupled to the current input 418, a calibration signal 558 that controls the calibration switch 426, a comparator enable signal 560 that is coupled to the enable input 472, and the output voltage 562 over the output 410.

The CSE enable signal 554 is kept high to ensure that any leakage on the line is included in the calibration process. The gate enable signal 552 is also kept high in order to prevent the device under test 302 from outputting current from any data inputs. In a first phase 570, the calibration signal 556 is pulled high thereby closing the calibration switch 426. Another calibration signal is pulled high to close the calibration switch 424. The comparator enable signal 558 is pulled low in order to reset the voltage output from the voltage comparator circuit 408. Any leakage current from the monitoring line of the device under test 302 is converted to a voltage which is stored on the capacitor 444.

A second phase 572 occurs when the calibration signal to the switch 424 is pulled low and then the calibration signal 556 is pulled low thereby opening the switch 426. The signal to the switch 424 is then pulled high closing the switch 424. A small current is output from the reference current source to the current input 418. The small current value is a minimum value corresponding to the minimum detectable signal (MDS) range of the current comparator 400.

A third phase 574 occurs when the comparator enable signal 560 is pulled high thereby allowing the voltage comparator circuit 408 to read the inputs. The output of the voltage comparator circuit 408 on the output 410 should be positive indicating a positive current comparison with the leakage current.

A fourth phase 576 occurs when the calibration signal 556 is pulled high again thereby closing the calibration switch 426. The comparator enable signal 558 is pulled low in order to reset the voltage output from the voltage comparator circuit 408. Any leakage current from the monitoring line of the device under test 302 is converted to a voltage which is stored on the capacitor 444.

A fifth phase 578 occurs when the calibration signal to the switch 424 is pulled low and then the calibration signal 556 is pulled low thereby opening the switch 426. The signal to the switch 424 is then pulled high closing the switch 424. A small current is output from the reference current source to the current input 418. The small current value is a minimum value corresponding to the minimum detectable signal (MDS) range of the current comparator 400 but is a negative current as opposed to the positive current in the second phase 572.

A sixth phase 580 occurs when the comparator enable signal 560 is pulled high thereby allowing the voltage comparator circuit 408 to read the inputs. The output of the voltage comparator circuit 408 on the output 410 should be zero indicating a negative current comparison with the leakage current.

The phases 570, 572, 574, 576, 578 and 580 are repeated. By adjusting the value of the bias current, eventually the rate of the valid output voltage toggles between a one and a zero will maximize indicating an optimal bias current value.

Figure 6:
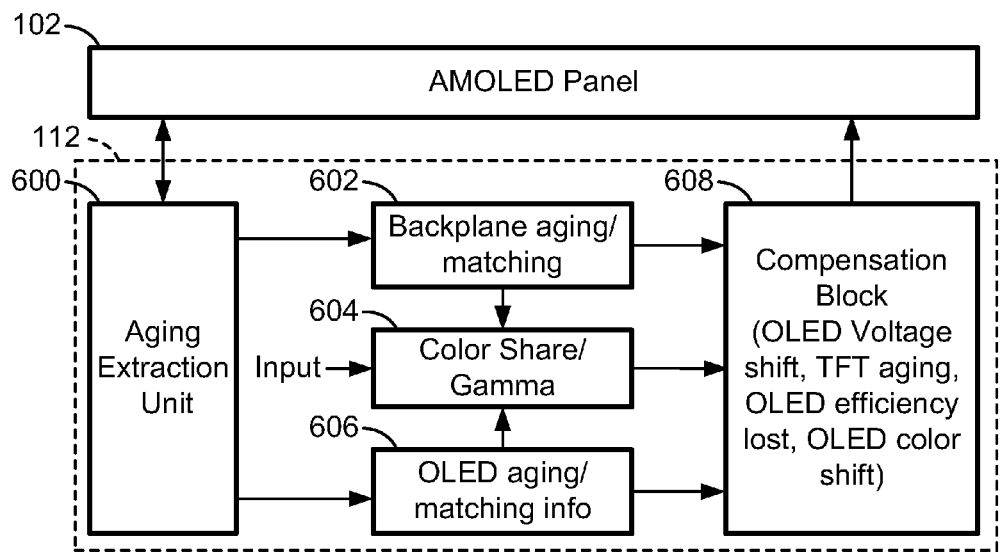
FIG. 6 is a block diagram of a reference current system to compensate for the aging of the AMOLED display in FIG. 1.

FIG. 6 is a block diagram of the compensation components of the controller 112 of the display system 100 in FIG. 1. The compensation components include an aging extraction unit 600, a backplane aging/matching module 602, a color/share gamma correction module 604, an OLED aging memory 606, and a compensation module 608. The backplane with the electronic components for driving the display system 100 may be any technology including (but not limited to) amorphous silicon, poly silicon, crystalline silicon, organic semiconductors, oxide semiconductors. Also, the display system 100 may be any display material (or device) including (but not limited to) LEDs, or OLEDs.

The aging extraction unit 600 is coupled to receive output data from the array 102 based on inputs to the pixels of the array and corresponding outputs for testing the effects of aging on the array 102. The aging extraction unit 600 uses the output of the column reference pixels 130 as a baseline for comparison with the output of the active pixels 104a-d in order to determine the aging effects on each of the pixels 104a-d on each of the columns that include the respective column reference pixels 130. Alternatively, the average value of the pixels in the column may be calculated and compared to the value of the reference pixel. The color/share gamma correction module 604 also takes data from the column reference pixels 130 to determine appropriate color corrections to compensate from aging effects on the pixels. The baseline to compare the measurements for the comparison may be stored in lookup tables on the memory 606. The backplane aging/matching module 602 calculates adjustments for the components of the backplane and electronics of the display. The compensation module 608 is provided inputs from the extraction unit 600 the backplane/matching module 602 and the color/share gamma correction module 604 in order to modify programming voltages to the pixels 104a-d in FIG. 1 to compensate for aging effects. The compensation module 608 accesses the look up table for the base data for each of the pixels 104a-d on the array 102 to be used in conjunction with calibration data. The compensation module 608 modifies the programming voltages to the pixels 104a-d accordingly based on the values in the look up table and the data obtained from the pixels in the display array 102.

The controller 112 in FIG. 2 measures the data from the pixels 104a-d in the display array 102 in FIG. 1 to correctly normalize the data collected during measurement. The column reference pixels 130 assist in these functions for the pixels on each of the columns. The column reference pixels 130 may be located outside the active viewing area represented by the pixels 104a-d in FIG. 1, but such reference pixels may also be embedded within the active viewing areas. The column reference pixels 130 are preserved with a controlled condition such as being un-aged, or aged in a predetermined fashion, to provide offset and cancellation information for measurement data of the pixels 104a-d in the display array 102. This information helps the controller 112 cancel out common mode noise from external sources such as room temperature, or within the system itself such as leakage currents from other pixels 104a-d. Using a weighted average from several pixels on the array 102 may also provide information on panel-wide characteristics to address problems such as voltage drops due to the resistance across the panel, i.e. current/resistance (IR) drop. Information from the column reference pixels 130 being stressed by a known and controlled source may be used in a compensation algorithm run by the compensation module 608 to reduce compensation errors occurring from any divergence. Various column reference pixels 130 may be selected using the data collected from the initial baseline measurement of the panel. Bad reference pixels are identified, and alternate reference pixels 130 may be chosen to insure further reliability. Of course it is to be understood that the row reference pixels 132 may be used instead of the column reference pixels 130 and the row may be used instead of columns for the calibration and measurement.

There are various compensation methods that may make use of the column reference pixels 130 in FIG. 1. For example in thin film transistor measurement, the data value required for the column reference pixel 130 to output a current is subtracted from the data value of a pixel 104a-d in the same column of pixels in the active area (the pixel array 102) to output the same current. The measurement of both the column reference pixels 130 and pixels 104a-d may occur very close in time, e.g. during the same video frame. Any difference in current indicates the effects of aging on the pixels 104a-d.

The resulting value may be used by the controller 112 to calculate the appropriate adjustment to programming voltage to the pixels 104a-d to maintain the same luminance during the lifetime of the display. Another use of a column reference pixel 130 is to provide a reference current for the other pixels 104 to serve as a baseline and determine the aging effects on the current output of those pixels. The reference pixels 130 may simplify the data manipulation since some of the common mode noise cancellation is inherent in the measurement because the reference pixels 130 have common data and supply lines as the active pixels 104. The row reference pixels 132 may be measured periodically for the purpose of verifying that luminance curves for the pixels that are stored for use of the controller for compensation during display production are correct.

A measurement of the drive transistors and OLEDs of all of the driver circuits such as the driver circuit 200 in FIG. 2 on a display before shipping the display take 60-120 seconds for a 1080p display, and will detect any shorted and open drive transistors and OLEDs (which result in stuck or unlit pixels). It will also detect non-uniformities in drive transistor or OLED performance (which result in luminance non-uniformities). This technique may replace optical inspection by a digital camera, removing the need for this expensive component in the production facility. AMOLEDs that use color filters cannot be fully inspected electrically, since color filters are a purely optical component. In this case, technology that compensates for aging such as MaxLife™ from Ignis may be useful in combination with an optical inspection step, by providing extra diagnostic information and potentially reducing the complexity of optical inspection.

These measurements provide more data than an optical inspection may provide. Knowing whether a point defect is due to a short or open driver transistor or a short or open OLED may help to identify the root cause or flaw in the production process. For example, the most common cause for a short circuit OLED is particulate contamination that lands on the glass during processing, shorting the anode and cathode of the OLED. An increase in OLED short circuits could indicate that the production line should be shut down for chamber cleaning, or searches could be initiated for new sources of particles (changes in processes, or equipment, or personnel, or materials).

A relaxation system for compensating for aging effects such as the MaxLife™ system may correct for process non-uniformities, which increases yield of the display. However the measured current and voltage relationships or characteristics in the TFT or OLED are useful for diagnostics as well. For example, the shape of an OLED current-voltage characteristic may reveal increased resistance. A likely cause might be variations in the contact resistance between the transistor source/drain metal and the ITO (in a bottom emission AMOLED). If OLEDs in a corner of a display showed a different current-voltage characteristic, a likely cause could be mask misalignment in the fabrication process.

A streak or circular area on the display with different OLED current-voltage characteristics could be due to defects in the manifolds used to disperse the organic vapor in the fabrication process. In one possible scenario, a small particle of OLED material may flake from an overhead shield and land on the manifold, partially obstructing the orifice. The measurement data would show the differing OLED current-voltage characteristics in a specific pattern which would help to quickly diagnose the issue. Due to the accuracy of the measurements (for example, the 4.8 inch display measures current with a resolution of 100 nA), and the measurement of the OLED current-voltage characteristic itself (instead of the luminance), variations can be detected that are not visible with optical inspection.

This high-accuracy data may be used for statistical process control, identifying when a process has started to drift outside of its control limits. This may allow corrective action to be taken early (in either the OLED or drive transistor (TFT) fabrication process), before defects are detected in the finished product. The measurement sample is maximized since every TFT and OLED on every display is sampled.

If the drive transistor and the OLED are both functioning properly, a reading in the expected range will be returned for the components. The pixel driver circuit requires that the OLED be off when the drive transistor is measured (and vice-versa), so if the drive transistor or OLED is in a short circuit, it will obscure the measurement of the other. If the OLED is a short circuit (so the current reading is MAX), the data will show the drive transistor is an open circuit (current reading MIN) but in reality, the drive transistor could be operational or an open circuit. If extra data about the drive transistor is needed, temporarily disconnecting the supply voltage (EL_VSS) and allowing it to float will yield a correct drive transistor measurement indicating whether the TFT is actually operational or in an open circuit.

In the same way, if the drive transistor is a short circuit, the data will show the OLED is an open circuit (but the OLED could be operational or an open circuit). If extra data about the OLED is needed, disconnecting the supply voltage (EL_VDD) and allowing it to float will yield a correct OLED measurement indicating whether the OLED is actually operational or in an open circuit.

If both the OLED and TFT in a pixel behave as a short circuit, one of the elements in the pixel (likely the contact between TFT and OLED) will quickly burn out during the measurement, causing an open circuit, and moving to a different state. These results are summarized in Table 1 below.

TABLE 1

|  |  | OLED | | |
| --- | --- | --- | --- | --- |
|  |  | Short | OK | Open |
| Drive transistor (TFT) | Short | n/a | TFT max OLED min | TFT max OLED min |
|  | OK | TFT min OLED max | TFT OK OLED OK | TFT OK OLED min |
|  | Open | TFT min OLED max | TFT min OLED OK | TFT min OLED min |

Figure 7:
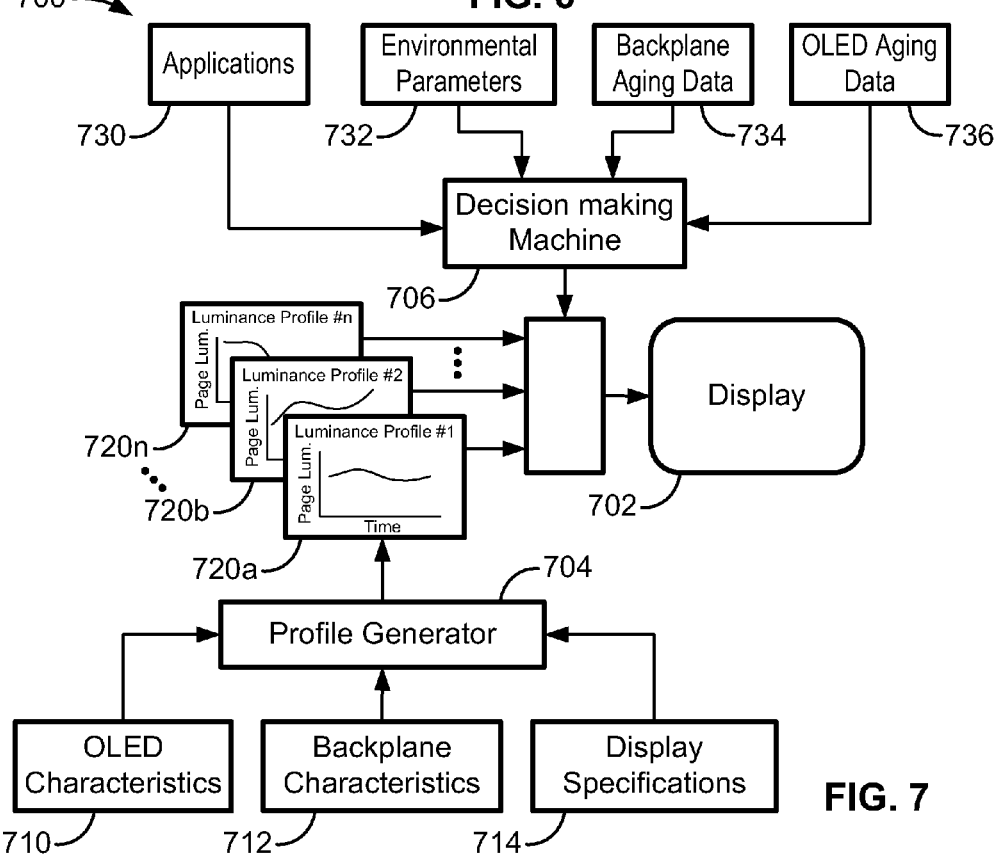
FIG. 7 is a block diagram of a system for the use of multiple luminance profiles for adjustment of a display in different circumstances.

FIG. 7 shows a system diagram of a control system 700 for controlling the brightness of a display 702 over time based on different aspects. The display 702 may be composed of an array of OLEDs or other pixel based display devices. The system 700 includes a profile generator 704 and a decision making machine 706. The profile generator 704 receives characteristics data from an OLED characteristics table 710, a backplane characteristics table 712 and a display specifications file 714. The profile generator 704 generates different luminance profiles 720a, 720b . . . 720n for different conditions. Here, to improve the power consumption, display lifetime, and image quality, the different brightness profiles 720a, 720b . . . 720n may be defined based on OLED and backplane information. Also, based on different applications, one can select different profiles from the luminance profiles 720a, 720b . . . 720n. For example, a flat brightness vs. time profile can be used for displaying video outputs such as movies whereas for brighter applications, the brightness can be drop at a defined rate. The decision making machine 706 may be software or hardware based and includes applications inputs 730, environmental parameter inputs 732, backplane aging data inputs 734 and OLED aging data inputs 736 that are factors in making adjustments in programming voltage to insure the proper brightness of the display 702.

To compensate for display aging perfectly, the short term and long term changes are separated in the display characteristics. One way is to measure a few points across the display with faster times between the measurements. As a result, the fast scan can reveal the short term effects while the normal aging extraction can reveal the long term effects.

Figure 8:
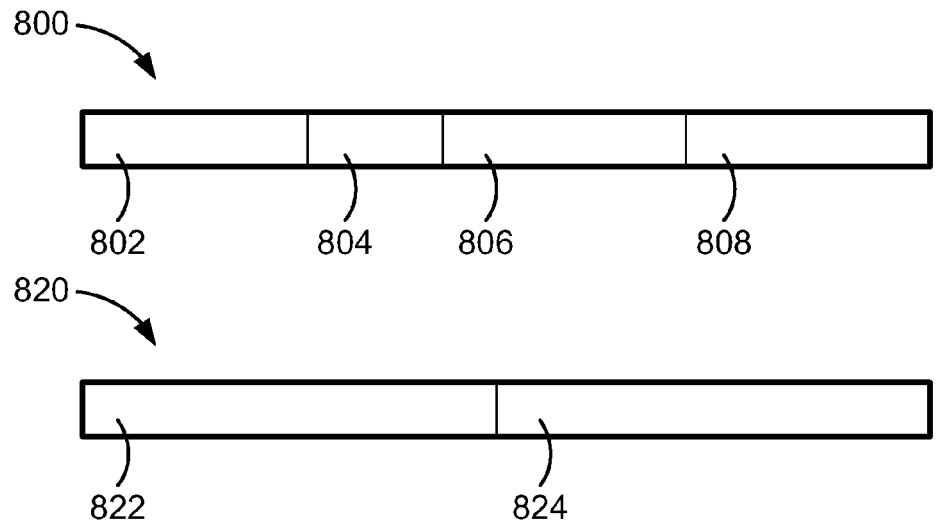
FIG. 8 are frame diagrams of video frames for calibration of pixels in a display.

The previous implementation of compensation systems uses a normal driving scheme, in which there was always a video frame shown on the panel and the OLED and TFT circuitries were constantly under electrical stress. Calibration of each pixel occurred during a video frame by changing the grayscale value of the active pixel to a desired value which caused a visual artifact of seeing the measured sub-pixel during the calibration. If the frame rate of the video is X, then in normal video driving, each video frame is shown on the pixel array 102 in FIG. 1 for 1/X of second and the panel is always running a video frame. In contrast, the relaxation video driving in the present example divides the frame time into four sub-frames as shown in FIG. 8. FIG. 8 is a timing diagram of a frame 800 that includes a video sub-frame 802, a dummy sub-frame 804, a relaxation sub-frame 806 and a replacement sub-frame 808.

The video sub-frame 802 is the first sub-frame which is the actual video frame. The video frame is generated the same way as normal video driving to program the entire pixel array 102 in FIG. 1 with the video data received from the programming inputs. The dummy sub-frame 804 is an empty sub-frame without any actual data being sent to the pixel array 102. The dummy sub-frame 804 functions to keep the same video frame displayed on the panel 102 for some time before applying the relaxation sub-frame 806. This increases the luminance of the panel.

The relaxation sub-frame 806 is the third sub-frame which is a black frame with zero gray scale value for all of the red green blue white (RGBW) sub-pixels in the pixel array 102. This makes the panel black and sets all of the pixels 104 to a predefined state ready for calibration and next video sub-frame insertion. The replacement sub-frame 808 is a short sub-frame generated solely for the purpose of calibration. When the relaxation sub-frame 806 is complete and the panel is black the data replacement phase starts for the next video frame. No video or blank data is sent to the pixel array 102 during this phase except for the rows with replacement data. For the non-replacement rows only the gate driver's clock is toggled to shift the token throughout the gate driver. This is done to speed up the scanning of the entire panel and also to be able to do more measurement per each frame.

Another technique is used to further alleviate the visual artifact of the measured sub-pixel during the replacement sub-frame 808. This has been done by re-programming the measured row with black as soon as the calibration is done. This returns the sub-pixel to the same state as it was during the relaxation sub-frame 806. However, there is still a small current going through the OLEDs in the pixels, which makes the pixel light up and become noticeable to the outside world. Therefore to re-direct the current going though OLED, the controller 112 is programmed with a non-zero value to sink the current from the drive transistor of the pixel and keep the OLED off.

Having a replacement sub-frame 808 has a drawback of limiting the time of the measurement to a small portion of the entire frame. This limits the number of sub-pixel measurements per each frame. This limitation is acceptable during the working time of the pixel array 102. However, for a quick baseline measurement of the panel it would be a time-consuming task to measure the entire display because each pixel must be measured. To overcome this issue a baseline mode is added to the relaxation driving scheme. FIG. 8 also shows a baseline frame 820 for the driving scheme during the baseline measurement mode for the display. The baseline measurement frame 820 includes a video sub-frame 822 and a replacement sub-frame 824. If the system is switched to the baseline mode, the driving scheme changes such that there would only be two sub-frames in a baseline frame such as the frame 820. The video sub-frame 822 includes the normal programming data for the image. In this example, the replacement (measurement sub-frame) 824 has a longer duration than the normal replacement frame as shown in FIG. 8. The longer sub-frame drastically increases the total number of measurements per each frame and allows more accurate measurements of the panel because more pixels may be measured during the frame time.

The steep slope of the $\Delta V$ shift (electrical aging) at the early OLED stress time results in a curve of efficiency drop versus $\Delta V$ shift that behaves differently for the low value of $\Delta V$ compared to the high $\Delta V$ ranges. This may produce a highly non-linear $\Delta \eta$-$\Delta V$ curve that is very sensitive to initial electrical aging of the OLED or to the OLED pre-aging process. Moreover, the shape (the duration and slope) of the early $\Delta V$ shift drop can vary significantly from panel to panel due to process variations.

The use of a reference pixel and corresponding OLED is explained above. The use of such a reference pixel cancels the thermal effects on the $\Delta V$ measurements since the thermal effects affect both the active and reference pixels equally. However, instead of using an OLED that is not aging (zero stress) as a reference pixel such as the column reference pixels 130 in FIG. 1, a reference pixel with an OLED having a low level of stress may be used. The thermal impact on the voltage is similar to the non-aging OLED, therefore the low stress OLED may still be used to remove the measurement noise due to thermal effects. Meanwhile, due to the similar manufacturing condition with the rest of OLED based devices on the same panel the slightly stressed OLED may be as a good reference to cancel the effects of process variations on the $\Delta \eta$-$\Delta V$ curve for the active pixels in a column. The steep early $\Delta V$ shift will also be mitigated if such an OLED is used as a reference.

To use a stressed-OLED as a reference, the reference OLED is stressed with a constant low current (⅕ to ⅓ of full current) and its voltage (for a certain applied current) must be used to cancel the thermal and process issues of the pixel OLEDs as follows:

$$W = \frac{V_{pixelOLED} - V_{refOLED}}{V_{refOLED}}$$

Figure 9:
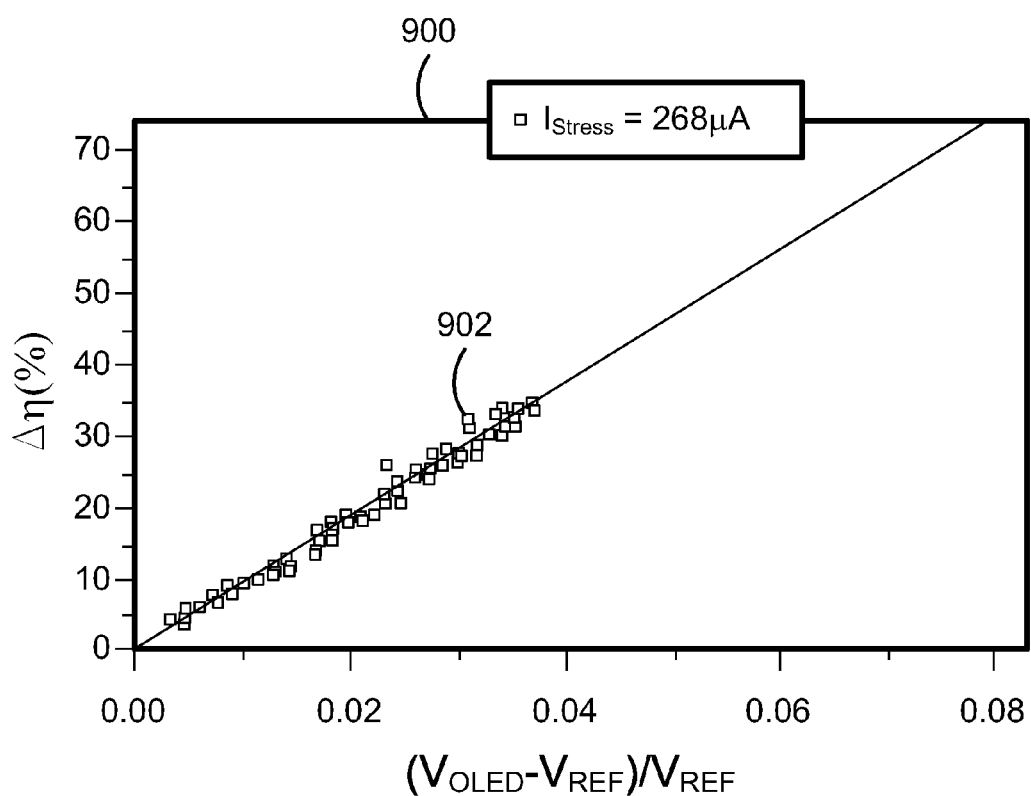
FIG. 9 is a graph showing the use of a small current applied to a reference pixel for more accurate aging compensation.

In this equation, W is the relative electrical aging based on the difference between the voltage of the active pixel OLED and the reference pixel OLED is divided by the voltage of the reference pixel OLED. FIG. 9 is a graph 900 that shows a plot 902 of points for a stress current of 268 uA based on the W value. As shown by the graph 900, the W value is a close-to-linear relation with the luminance drop for the pixel OLEDs as shown for a high stress OLED.

The above described methods of extracting baseline measurements of the pixels in the array may be performed by a processing device such as the 112 in FIG. 1 or another such device which may be conveniently implemented using one or more general purpose computer systems, microprocessors, digital signal processors, micro-controllers, application specific integrated circuits (ASIC), programmable logic devices (PLD), field programmable logic devices (FPLD), field programmable gate arrays (FPGA) and the like, programmed according to the teachings as described and illustrated herein, as will be appreciated by those skilled in the computer, software and networking arts.

In addition, two or more computing systems or devices may be substituted for any one of the controllers described herein. Accordingly, principles and advantages of distributed processing, such as redundancy, replication, and the like, also can be implemented, as desired, to increase the robustness and performance of controllers described herein.

The operation of the example baseline data determination methods may be performed by machine readable instructions. In these examples, the machine readable instructions comprise an algorithm for execution by: (a) a processor, (b) a controller, and/or (c) one or more other suitable processing device(s). The algorithm may be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the baseline data determination methods could be implemented by software, hardware, and/or firmware. Also, some or all of the machine readable instructions represented may be implemented manually.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A voltage-programmed display panel allowing measurement of effects on pixels in the panel, comprising:
a plurality of active pixels forming the display panel to display an image under an operating condition, the active pixels each being coupled to a supply line and a programming line for displaying images under said operating condition;
a reference pixel coupled to the supply line and the programming line, the reference pixel being coupled to said supply line and said programming line in a manner that said reference pixel has only a controlled condition independent of the operating condition; and
a controller coupled to each of the plurality of active pixels and reference pixel, the controller causing a test voltage to be applied to the plurality of active pixels and the reference pixel, the controller further comparing an output of the reference pixel in comparison with the output of one of the plurality of active pixels.

2. The system of claim 1, wherein the active pixels and the reference pixel each include a drive transistor and an organic light emitting device coupled to the drive transistor.

3. The system of claim 1, wherein the controller compensates a programming voltage to the one of the plurality of pixels based on the comparison of the output of the reference pixel with the output of the one of the plurality of active pixels.

4. The system of claim 1, wherein the reference pixel is one of a plurality of reference pixels, and the controller determines whether the reference pixel is functioning, and if the reference pixel is not functioning, the test voltage is applied to another reference pixel of the plurality of reference pixels.

5. The system of claim 1, wherein the panel has columns and rows of pixels, and the reference pixel is associated with a column of pixels.

6. The system of claim 5, wherein output from the reference pixel and the one of a plurality of active pixels is an output current.

7. The system of claim 1, wherein the reference pixel is associated with a row of pixels.

8. The system of claim 7, further comprising a memory storing luminance curve data for the one of the plurality of active pixels, and wherein the controller compares the stored luminance curve data with the output from the reference pixel.

9. The system of claim 1, wherein the controlled condition of the reference pixel is an un-aged condition, wherein the plurality of active pixels are affected by aging when displaying images.

10. The system of claim 1, wherein the plurality of active pixels have an applied current level and wherein the reference pixel has an applied current level less than the current level of the plurality of active pixels.

* * * * *